(12) United States Patent
Kuyel

(10) Patent No.: US 7,002,496 B2
(45) Date of Patent: Feb. 21, 2006

(54) ALL-DIGITAL CALIBRATION OF STRING DAC LINEARITY USING AREA EFFICIENT PWL APPROXIMATION: ELIMINATING HARDWARE SEARCH AND DIGITAL DIVISION

(75) Inventor: Turker Kuyel, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/007,604

(22) Filed: Dec. 8, 2004

(65) Prior Publication Data

US 2005/0146452 A1 Jul. 7, 2005

Related U.S. Application Data

(60) Provisional application No. 60/534,733, filed on Jan. 7, 2004.

(51) Int. Cl.
 *H03M 1/10* (2006.01)
(52) U.S. Cl. ............... 341/120; 341/118; 341/144
(58) Field of Classification Search ............ 341/118, 341/120, 144, 145, 154, 121
See application file for complete search history.

(56) References Cited

U.S. PATENT DOCUMENTS

| 5,825,317 A | * | 10/1998 | Anderson et al. | ............ 341/120 |
| 6,351,228 B1 | * | 2/2002 | Kutsuno et al. | ............ 341/120 |
| 6,417,794 B1 | * | 7/2002 | Munoz et al. | .............. 341/161 |

* cited by examiner

*Primary Examiner*—John B Nguyen
(74) *Attorney, Agent, or Firm*—W. Daniel Swayze, Jr.; W. James Brady; Frederick J. Telecky, Jr.

(57) ABSTRACT

A system and method of calibrating a digital-to-analog converter (DAC) such as a resistor string DAC that reduces costs by making more efficient use of integrated circuit chip area, without requiring analog calibration circuits. The DAC calibration system includes a main DAC to be calibrated, a memory, and calibration logic circuitry for performing arithmetical operations. The memory stores a predetermined number of digital code values in respective memory locations, which are indexed by corresponding voltage values. The digital code values represent DAC input code values which, when applied to the main DAC, would generate the corresponding index voltage values as DAC output voltage levels. The stored DAC input code values and the corresponding DAC output voltage levels, which are determined using an external tester, define piecewise linear (PWL) breakpoint code values of a PWL approximation of the DAC transfer function.

21 Claims, 5 Drawing Sheets

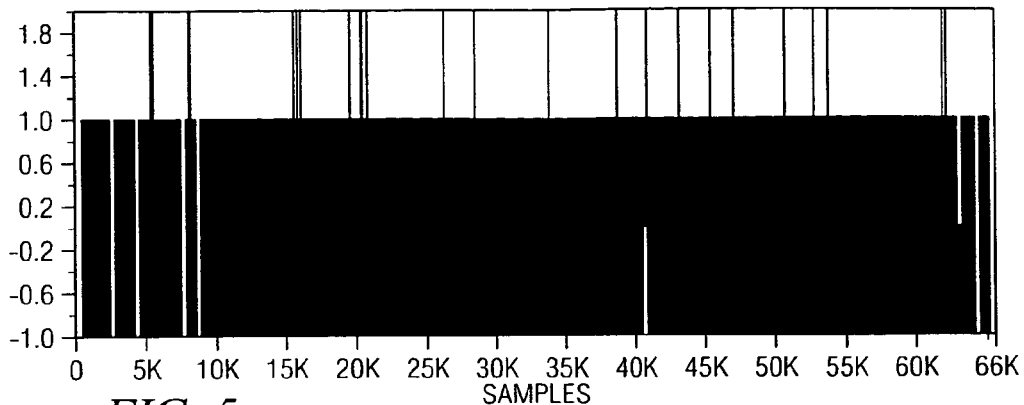

*FIG. 5e*

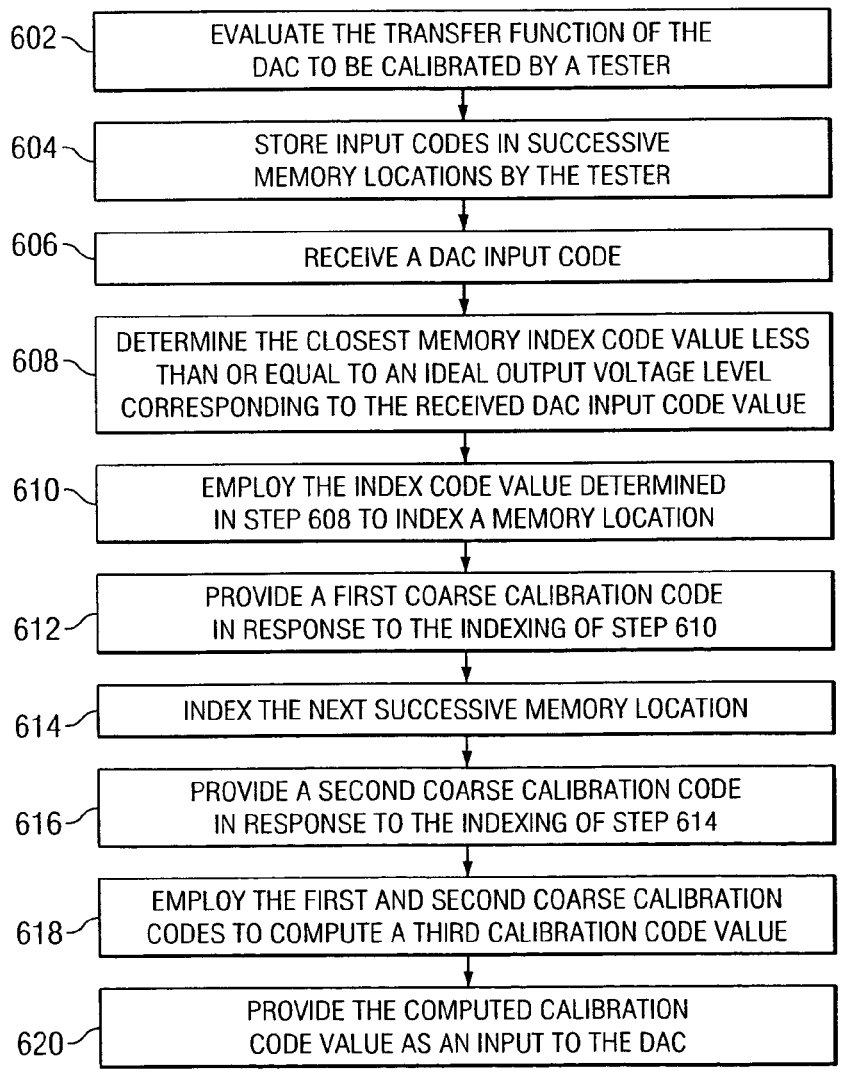

*FIG. 6*

- 602: EVALUATE THE TRANSFER FUNCTION OF THE DAC TO BE CALIBRATED BY A TESTER
- 604: STORE INPUT CODES IN SUCCESSIVE MEMORY LOCATIONS BY THE TESTER
- 606: RECEIVE A DAC INPUT CODE
- 608: DETERMINE THE CLOSEST MEMORY INDEX CODE VALUE LESS THAN OR EQUAL TO AN IDEAL OUTPUT VOLTAGE LEVEL CORRESPONDING TO THE RECEIVED DAC INPUT CODE VALUE
- 610: EMPLOY THE INDEX CODE VALUE DETERMINED IN STEP 608 TO INDEX A MEMORY LOCATION
- 612: PROVIDE A FIRST COARSE CALIBRATION CODE IN RESPONSE TO THE INDEXING OF STEP 610
- 614: INDEX THE NEXT SUCCESSIVE MEMORY LOCATION
- 616: PROVIDE A SECOND COARSE CALIBRATION CODE IN RESPONSE TO THE INDEXING OF STEP 614
- 618: EMPLOY THE FIRST AND SECOND COARSE CALIBRATION CODES TO COMPUTE A THIRD CALIBRATION CODE VALUE
- 620: PROVIDE THE COMPUTED CALIBRATION CODE VALUE AS AN INPUT TO THE DAC

ALL-DIGITAL CALIBRATION OF STRING DAC LINEARITY USING AREA EFFICIENT PWL APPROXIMATION: ELIMINATING HARDWARE SEARCH AND DIGITAL DIVISION

CROSS REFERENCE TO RELATED APPLICATIONS

This application claims priority of U.S. Provisional Patent Application No. 60/534,733 filed Jan. 7, 2004 entitled ALL-DIGITAL CALIBRATION OF STRING DAC LINEARITY USING AREA EFFICIENT PWL APPROXIMATION: ELIMINATING HARDWARE SEARCH AND DIGITAL DIVISION.

STATEMENT REGARDING FEDERALLY SPONSORED RESEARCH OR DEVELOPMENT

N/A

BACKGROUND OF THE INVENTION

The present application relates generally to digital-to-analog converters, and more specifically to an area efficient piece-wise linear calibration technique for resistor string digital-to-analog converters.

Digital-to-analog converters (DACs) are known that employ resistor strings to convert digital input code values into analog output voltage levels. In a typical mode of operation, a conventional resistor string DAC receives digital code values at an input of the DAC, and employs a resistor string to convert the respective digital input code values into corresponding analog voltage levels at an output of the DAC. Each digital input code represents a quantized value, which is converted into a corresponding analog output voltage based on the transfer function of the DAC.

The conventional resistor string DAC includes a number of resistors connected in series, in which each resistor has a voltage tap at each of its ends. Further, the resistor string is typically biased at each of its opposing ends by two different reference voltages. For example, one reference voltage may be a positive voltage and the other reference voltage may be a negative voltage. Accordingly, the resistor string forms a voltage divider network, and each voltage tap of the resistor string is accessible to obtain a desired digital-to-analog conversion.

One drawback of the conventional resistor string DAC is that the offset, gain, and/or integral non-linearity of the DAC are typically imperfect. As a result, the analog output voltage produced by the DAC frequently has an error component, which prevents the amplitude of the DAC output voltage from directly corresponding to the magnitude of the digital code at the DAC input.

One way of improving the offset, gain, and integral non-linearity of the conventional resistor string DAC is to employ a digital calibration technique. For example, a conventional circuit for digitally calibrating a resistor string DAC may include a main DAC to be calibrated, a calibration DAC, a memory, and calibration logic circuitry for performing arithmetical operations. In a typical mode of operation, a plurality of integral non-linearity error values of the main DAC are determined, and the error values are coded into the memory as control points. Next, when a digital code value is applied to the main DAC input, a determination is made as to which two adjacent control points the input code lies between. A piecewise linear (PWL) function is then established between the two control points, and an error value is interpolated from the PWL function corresponding to the applied input code by the calibration logic. The interpolated error values are representative of an interpolated approximation of the main DAC's integral non-linearity curve. Next, the interpolated error value is applied to the input of the calibration DAC to produce a corresponding analog output voltage, which is subsequently subtracted from the output of the main DAC to remove the error component therefrom.

However, implementing the above-described conventional digital DAC calibration technique on an integrated circuit chip can be problematic, particularly in high voltage applications that employ large geometry process technology. This is because when such large geometry processes are employed, the amount of chip area required by the calibration logic circuitry for performing the PWL approximations can be relatively large, which can significantly increase costs. Another drawback is the need to provide analog calibration DACs, which can be imperfect.

It would therefore be desirable to have an improved calibration technique for digital-to-analog converters. Such a DAC calibration technique would be adaptable for calibrating DACs that employ resistor strings. It would also be desirable to have a DAC calibration technique that makes more efficient use of integrated circuit chip area.

BRIEF SUMMARY OF THE INVENTION

In accordance with the present invention, a system and method of calibrating a digital-to-analog converter (DAC) such as a resistor string DAC is provided that reduces costs by making more efficient use of integrated circuit chip area. Benefits of the presently disclosed DAC calibration technique are achieved by employing a tester for searching through DAC measurement data to find DAC input code values corresponding to ideal uniformly spaced DAC output voltage levels. Such use of a tester in this DAC calibration technique significantly reduces the amount of calibration logic circuitry required on-chip.

In one embodiment, a DAC calibration system includes a main DAC to be calibrated, a memory, and calibration logic circuitry for performing arithmetical operations. The memory is configured to store a predetermined number of digital code values in respective memory locations, which are indexed by codes representing corresponding analog voltage levels. The digital code values stored in the memory are representative of DAC input code values which, when applied to the main DAC, generate the corresponding uniformly spaced analog voltage levels as DAC output voltages. The stored DAC input codes and the corresponding DAC output voltages, which are determined using a tester, define piecewise linear (PWL) breakpoint code values of a PWL approximation of the DAC transfer function.

In the presently disclosed embodiment, a DAC calibration method includes receiving a DAC input code value by the calibration logic circuitry. The calibration logic employs a predetermined number of higher order bits of the DAC input code value to generate a first pointer for pointing to a first memory index, which represents the closest DAC output voltage level less than or equal to the level that the DAC input code value would ideally generate. Next, the calibration logic provides the first pointer as a first index to the memory. In response, the memory provides a first code value to the calibration logic. The first code value, which is stored in the memory location pointed to by the first pointer, represents a first "coarse" calibration code value. The calibration logic then generates a second pointer for pointing to a second memory index, and provides the second pointer as a second index to the memory. In the preferred embodiment, the second pointer equals the first pointer incremented by one memory location. In response, the memory provides a second code value to the calibration logic. The second code value, which is stored in the memory location pointed to by the second pointer, represents a second coarse calibration code value. Next, the calibration logic computes a desired calibration code value using the first and second coarse calibration code values by a PWL approximation technique, and provides the computed calibration code value to the input of the main DAC. As a result, the main DAC generates a DAC output voltage level that closely approximates the DAC input code value.

By employing a tester to search a set of DAC measurement data to find DAC input code values corresponding to ideal DAC output voltage levels, the amount of on-chip calibration logic circuitry in the above-described DAC calibration system can be reduced. Further, because the DAC output voltage levels are uniformly spaced and can therefore be easily determined, the need to store indications of the DAC output voltages in memory is avoided. As a result, memory storage requirements can be reduced, and more efficient use of chip area can be achieved.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIG. 5e is an illustrative diagram of the calibrated differential non-linearity of the main DAC included in the DAC calibration system of FIG. 1; and FIG. 6 is a flow diagram of a method of operating the DAC calibration system of FIG. 1.

DETAILED DESCRIPTION OF THE INVENTION

U.S. Provisional Patent Application No. 60/534,733 filed Jan. 7, 2004 entitled ALL-DIGITAL CALIBRATION OF STRING DAC LINEARITY USING AREA EFFICIENT PWL APPROXIMATION: ELIMINATING HARDWARE SEARCH AND DIGITAL DIVISION is incorporated herein by reference.

A system and method of calibrating a digital-to-analog converter (DAC) is provided that reduces costs by making more efficient use of integrated circuit (IC) chip area. The presently disclosed DAC calibration system and method employs a tester to search DAC measurement data for DAC input codes corresponding to ideal uniformly spaced DAC output voltages, thereby reducing the amount of area that would otherwise be required on-chip for the calibration logic circuitry.

Figure 1:
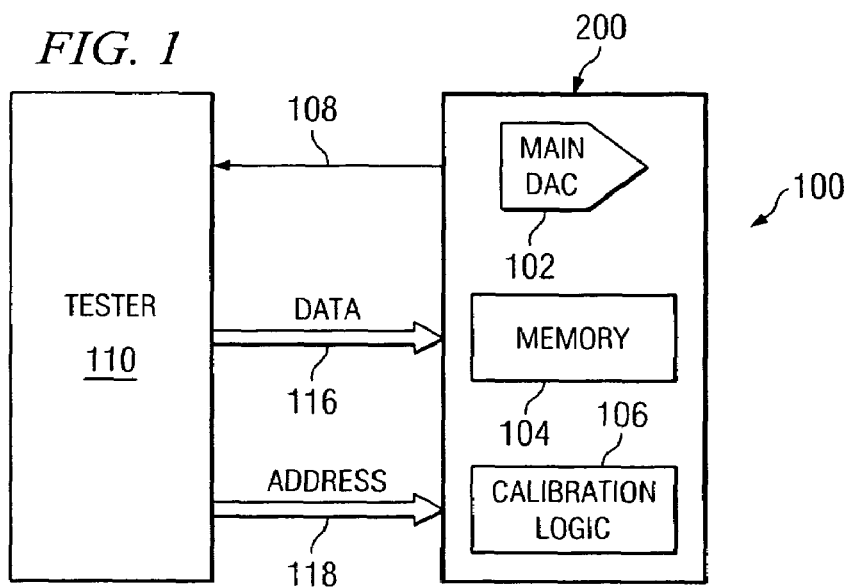
FIG. 1 is a block diagram of a digital-to-analog converter (DAC) calibration system according to the present invention.

FIG. 1 depicts an illustrative embodiment of a DAC calibration system 100, in accordance with the present invention. In the illustrated embodiment, the DAC calibration system 100 comprises a tester 110 and DAC calibration circuitry 200, which includes a main DAC 102 to be calibrated, a memory 104, and calibration logic circuitry 106 for performing arithmetical operations (see also FIG. 2). For example, the tester 110 may comprise any suitable system or device coupleable to the DAC calibration circuitry 200, and operative to determine whether or not the DAC calibration circuitry 200 is functioning properly. In one embodiment, the tester 110 is an external automated test equipment (ATE). Those of ordinary skill in this art will appreciate that such a tester may comprise a test computer coupled to a test head, which is configured to interface with semiconductor device handling equipment. Accordingly, in the preferred embodiment, the DAC calibration circuitry 200 is implemented in the form of an IC chip, which may interface with the tester 110 via suitable semiconductor device handling equipment for subsequent production testing. It is understood, however, that the DAC calibration circuitry 200 may alternatively be implemented as a plurality of IC chips or as discrete electronic devices.

As shown in FIG. 1, the DAC calibration system 100 further includes respective data and address buses 116 and 118, which are operable to provide data and address information from the tester 110 to the DAC calibration circuitry 200. In addition, the DAC calibration system 100 includes a line 108, which is operable to provide analog output voltage levels from the main DAC 102 to the tester 110. It is noted that indications of the specific connections of the buses 116 and 118 and the line 108 between the tester 110 and the main DAC 102, the memory 104, and the calibration logic 106 are omitted from FIG. 1 for clarity of illustration.

In the preferred embodiment, the memory 104 is configured to store a plurality of digital code values in respective memory locations, which are addressed or indexed by codes representing corresponding analog voltage levels. The digital code values stored in the memory 104 represent input codes which, when applied to the main DAC 102, cause the main DAC 102 to generate the corresponding analog voltage levels as DAC output voltages. Further, the stored DAC input codes and the corresponding DAC output voltages are determined by the tester 110. Because DACs such as the main DAC 102 are normally tested for all input code values during production testing, the determination of the stored DAC input codes and the corresponding DAC output voltages by the tester 110 does not typically require a substantial number of additional production test steps. For example, the tester 110 may apply the DAC input codes to the main DAC 102 via the data bus 116, and may receive the corresponding DAC output voltages via the line 108. The tester 110 may then employ the data and address buses 116 and 118 to store the DAC input codes in respective locations of the memory 104.

In the presently disclosed embodiment, the main DAC 102 has a resistor string architecture. Those of ordinary skill in this art will appreciate that resistor string DACs typically have less than optimal integral non-linearity characteristics. As a result, the DAC output voltages produced by the resistor string DAC 102 may include error components, which may prevent the amplitude of the DAC output voltages from directly corresponding to the magnitude of the DAC input codes.

To reduce the integral non-linearity of the main DAC 102, the DAC calibration circuitry 200 (see FIGS. 1–2) operates so that the main DAC 102, in effect, calibrates itself, without requiring the use of an additional calibration DAC. Specifically, the combination of the memory 104 and the calibration logic circuitry 106 is operable to effectively search the transfer function of the main DAC 102 for DAC input code values that produce desired DAC output voltage levels, and to provide the DAC input codes to the main DAC 102. If sufficient memory resources were available, then the memory 104 might be configured to store all possible DAC input code values. As a result, in response to an applied input code value, the DAC calibration circuitry 200 would search all locations within the memory 104 to locate the DAC input code that, when provided to the main DAC 102, would cause the main DAC 102 to generate an analog output voltage closely approximating the applied digital input code. However, such a memory, along with the circuitry required to search it, would likely consume a prohibitive amount IC chip area.

Figure 3A:
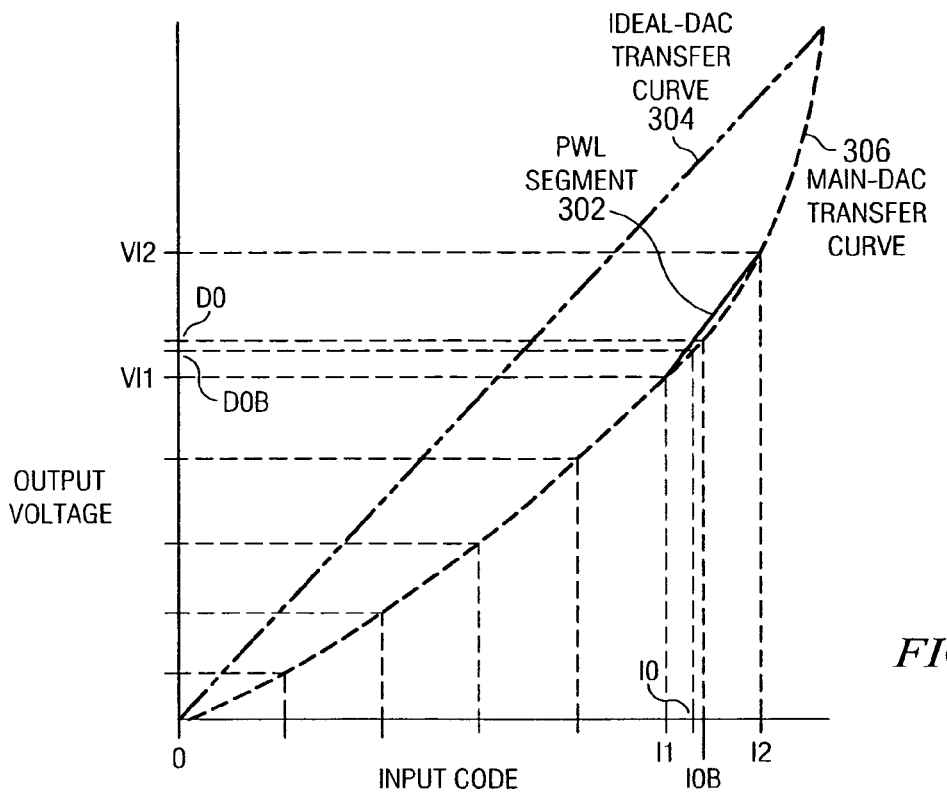
FIGS. 3a–3b are diagrams illustrating piecewise linear (PWL) approximations of portions of the transfer function of the main DAC included in the DAC calibration system of FIG. 1.
Figure 3B:
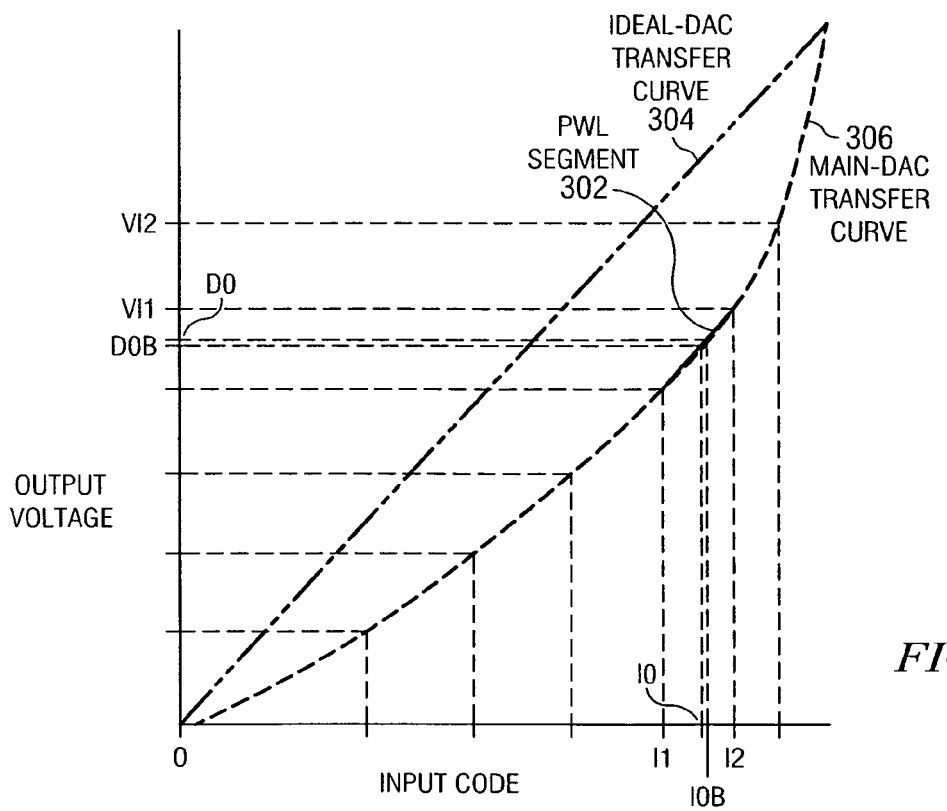

In the presently disclosed embodiment, instead of searching the entire transfer function of the main DAC 102, the DAC calibration circuitry 200 searches a piecewise linear (PWL) approximation of the DAC transfer function. This search technique will be better understood with reference to the following illustrative examples, as depicted in FIGS. 3a–3b. Specifically, FIG. 3a is a diagram depicting an ideal transfer function 304 of the main DAC, and a segment 302 of a first PWL approximation of an actual DAC transfer function 306. It is noted that the PWL segment 302 has a first end point defined by a DAC output voltage VI1 and a DAC input code I1, and a second end point defined by a DAC output voltage VI2 and a DAC input code I2. In this example, the first PWL approximation is achieved using equidistant DAC input code values such as the input codes I1 and I2, as indicated along the horizontal axis of the diagram of FIG. 3a. It is understood that the respective DAC input code values on the horizontal axis, when applied to the main DAC, cause the main DAC to generate corresponding DAC output voltage levels such as the output voltages VI1 and VI2 on the vertical axis of the diagram of FIG. 3a.

In this first example, the horizontal axis of FIG. 3a is normalized to accommodate a plurality of "ideal" DAC input codes. An ideal DAC input code is defined herein as a DAC input code value that, when applied to the main DAC digital input, would cause the main DAC to produce a corresponding output voltage level having no error component(s). Such a DAC output voltage level is designated herein as an ideal DAC output voltage.

As shown in FIG. 3a, given a desired DAC input code representing an ideal DAC output voltage D0, a search of the PWL approximation (including the PWL segment 302) of the DAC transfer function 306 results in the identification of an approximate DAC input code I0. Due to the error component introduced by the PWL approximation, the actual DAC input code I0B corresponding to the ideal DAC output voltage is not immediately found. The geometry of the PWL approximation may be represented by the equation $$I0 = I1 + (I2-I1)(D0-VI1)/(VI2-VI1), \quad (1)$$

in which "D0" is the desired output voltage, "D0B" is the main DAC output voltage approximating D0, "I0" is the main DAC input code generating D0B, "I0B" is the main DAC input code generating D0, "I1" is the lesser main DAC input code generating the PWL segment corresponding to D0, "I2" is the greater main DAC input code generating the PWL segment corresponding to D0, "VI1" is the main DAC output voltage corresponding to I1, and "VI2" is the main DAC output voltage corresponding to I2.

It is noted that the PWL approximation error is equal to the difference D0–D0B (see FIG. 3a). The magnitude of this PWL approximation error may be reduced by using a suitable number of additional PWL segments. Further, the main DAC output voltages VIX, e.g., VI1 and VI2, may be stored in successive locations of the on-chip memory of the DAC calibration circuitry. The output voltage VI1 may be found by searching the memory to determine the PWL segment corresponding to the output voltage D0. When the output voltage VI1 is found, the output voltage VI2 may be extracted from the next location within the memory. Moreover, the equidistant input codes I1 and I2 corresponding to the output voltages VI1 and VI2, respectively, may be employed to index the memory. It is further noted that an arithmetic division operation is required to solve equation (1) above because, in this first example, the DAC output voltages VIX are not uniformly spaced along the vertical axis of FIG. 3a. Therefore, the difference between successive DAC output voltages, in this example, cannot be easily determined.

As explained above, the illustrative PWL approximation depicted in FIG. 3a employs equidistant main DAC input codes to calibrate the resistor string DAC. In the above PWL approximation, M equidistant PWL segments and M+1 PWL breakpoint codes are employed, starting at the DAC input code 0 and ending at the full scale DAC input code. With this technique, a plurality of main DAC output voltages corresponding to M+1 equidistant DAC input codes may be measured to determine the error at each breakpoint of the PWL segments.

Specifically, for each breakpoint between two adjacent PWL segments, the main DAC output voltage is measured, the measurement voltage is normalized to an ideal DAC input code, and the result is stored within the on-chip memory. Next, when an input code D0 is applied to the main DAC, representing the ideal DAC input code corresponding to the desired DAC output voltage, a search operation is performed to find the PWL segment corresponding to the input code D0. Such a search operation includes comparing the input code D0 to the contents of the memory locations to find the closest breakpoint code value less than or equal to D0. In this first example, this breakpoint code value is VI1 (see FIG. 3a). When VI1 is found, the input codes I1 and I2 and the output voltage VI2 may be identified as follows. The input code I1 is the index of the memory location storing the output voltage VI1, the input code I2 is the index of the next memory location, and the output voltage VI2 is the contents of the memory location indexed by the input code I2.

Once the DAC output voltages VI1, VI2 and the DAC input codes I1, I2 are found, equation (1) may be employed to determine the main DAC input code value I0 that approximates the desired DAC output voltage D0. It is noted that for a binary number of PWL segments, the difference I2–I1 is a binary number, and therefore the multiplication operation in equation (1) may be accomplished by an arithmetic left-shift. However, because the difference VI2–VI1 cannot be easily determined in this example, a suitable divider is required to perform the division operation in equation (1).

FIG. 3b is a diagram depicting the ideal transfer function 304 of the main DAC, and a segment 303 of a second PWL approximation of the actual DAC transfer function 306. Like the PWL segment 302 of FIG. 3a, the PWL segment 303 has a first end point defined by a DAC output voltage VI1 and a DAC input code I1, and a second end point defined by a DAC output voltage VI2 and a DAC input code I2. However, whereas the first PWL approximation described above is obtained using equidistant DAC input code values, the second PWL approximation is obtained using equidistant, i.e., uniformly spaced, DAC output voltage levels.

In this second example, a production tester such as the tester 110 (see FIG. 1) is employed to allow a simplification of the design of the DAC calibration circuit. Specifically, instead of determining the error at M+1 equidistant main DAC input codes before evaluating the PWL approximation, as in the first example above, the error at each main DAC input code is determined by the tester. In effect, the tester determines the integral non-linearity of the DAC. Next, a search operation, preferably implemented in software within the tester, is performed to find the main DAC input codes corresponding to the ideal uniformly spaced DAC output voltages for M PWL segments (comprising M+1 breakpoints).

Accordingly, the PWL approximation of this second example is obtained using uniformly spaced DAC output voltage levels such as the voltage outputs VI1 and VI2, as indicated along the vertical axis of FIG. 3b. In effect, the vertical axis of FIG. 3b is divided into a predetermined number of equal segments via the search operation performed by the tester on the DAC measurement data. It should be appreciated that because DACs are normally tested for all input code values during production, the search operation of the tester typically does not require a significant number of additional production test steps. Moreover, the technique illustrated by this second example obviates the need for on-chip digital search circuitry and on-chip digital divider circuitry, thereby permitting more efficient use of the IC chip area.

In this second example, the following assumptions are made: (1) the main DAC is a monotonic resistor string DAC or any other suitable monotonic DAC, (2) the main DAC has a negative offset error and a positive full scale error (i.e., the main DAC is operative to cover the entire voltage range from Vref− to Vref+), and (3) the PWL approximation employs M PWL segments, in which M is a binary number equal to $2^K$. Further, a suitable tester is employed to evaluate the DAC transfer function, and to search the DAC measurement data to find the DAC input codes corresponding to ideal DAC output voltages for ideal codes $2^N/M$, $2*2^N/M$, $3*2^N/M$, and so on. Moreover, the on-chip memory is configured to provide M+1 memory locations, in which the indices and the contents of these memory locations are designated as VIX (representing the DAC output voltages) and IX (representing the DAC input codes), respectively. The results of the search performed by the tester are stored within the on-chip memory.

In accordance with this second example, the calibration logic of the DAC calibration circuitry receives at least one DAC input code value via a data bus 202 (see FIG. 2), and employs the K higher order bits of the DAC input code to point to the index VI1, which represents the closest DAC output voltage less than or equal to the output voltage that the DAC would ideally generate. Specifically, the calibration logic determines a pointer m using the equation $$VI1 = m*2^K. \quad (2)$$

Figure 2:
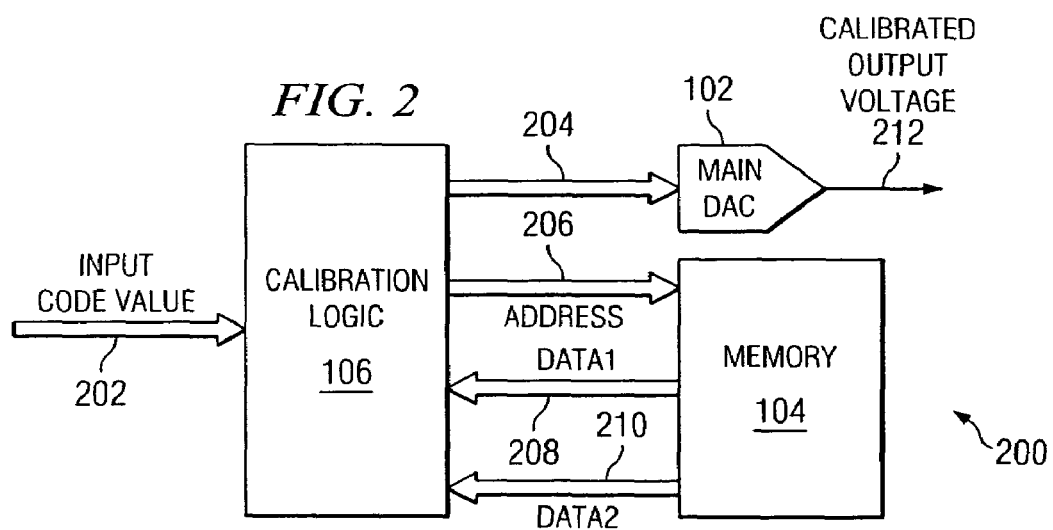
FIG. 2 is a block diagram of a main DAC, a memory, and calibration logic circuitry included in the DAC calibration system of FIG. 1.

The calibration logic then provides the pointer m to the memory via an address bus 206 (see FIG. 2). In response, the memory provides a first code value I1 contained in the memory location pointed to by the pointer m to the calibration logic via a first data bus 208 (Data1; see FIG. 2).

Next, the calibration logic determines a pointer m+1 using the equation $$VI2 = (m+1)*2^K. \quad (3)$$

The calibration logic then provides the pointer m+1 to the memory via the bus 306, which subsequently provides a second code value I2 contained in the memory location pointed to by the pointer m+1 to the calibration logic via a second data bus 210 (Data2; see FIG. 2).

Next, the calibration logic computes the closest DAC input code I0 corresponding to the desired DAC output voltage D0 by PWL approximation using equation (1). As indicated above, for a binary number of PWL segments, the difference I2−I1 is a binary number, and therefore the multiplication operation in equation (1) may be accomplished by an arithmetic left-shift. In addition, because the DAC output voltage values VIX on the vertical axis of FIG. 3b are uniformly spaced (e.g., VI2−VI1 is equal to $2^K$), the division operation in equation (1) may be accomplished by an arithmetic right-shift. Finally, the calibration logic provides the computed input code value I0 to the main DAC via a bus 204 (see FIG. 2), and the main DAC produces a DAC output voltage closely approximating the desired output voltage D0 on a line 212 (Calibrated output voltage; see FIG. 2).

Figure 4A:
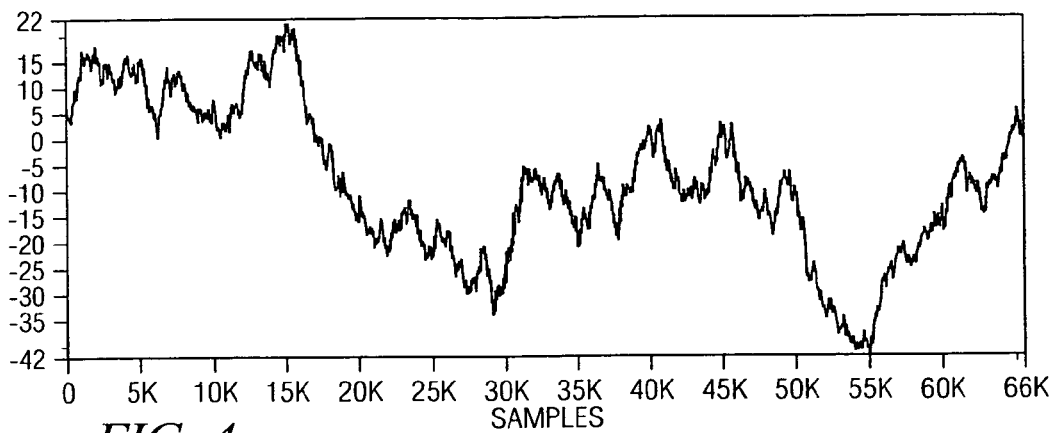
FIGS. 4a–4b are illustrative diagrams of the uncalibrated integral non-linearity and the uncalibrated differential non-linearity, respectively, of the main DAC included in the DAC calibration system of FIG. 1.
Figure 4B:
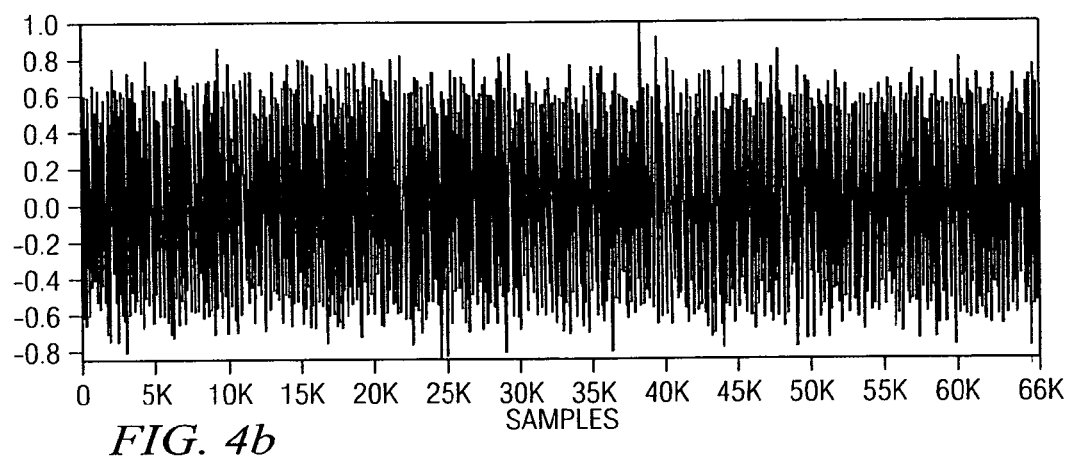

FIGS. 4a–4b depict illustrative diagrams of the uncalibrated integral non-linearity and the uncalibrated differential non-linearity, respectively, of a monotonic DAC prior to calibration. Specifically, FIGS. 4a and 4b depict the uncalibrated integral non-linearity and the uncalibrated differential non-linearity of a representative 16-bit resistor string DAC, respectively.

Figure 5A:
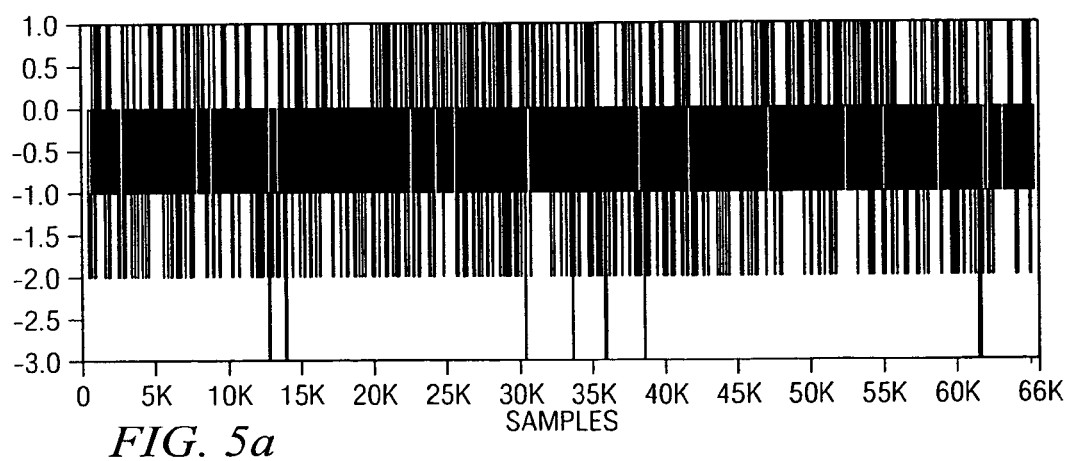
FIGS. 5a–5d are illustrative diagrams of the calibrated integral non-linearity of the main DAC included in the DAC calibration system of FIG. 1.
Figure 5B:
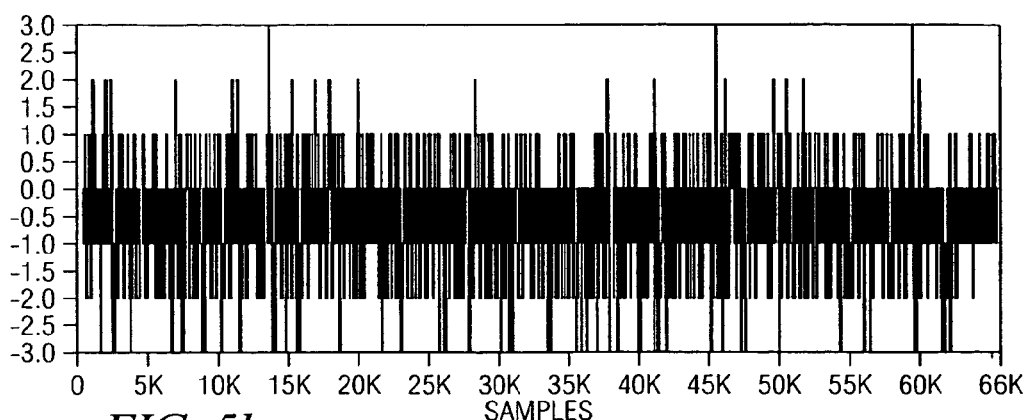
Figure 5C:
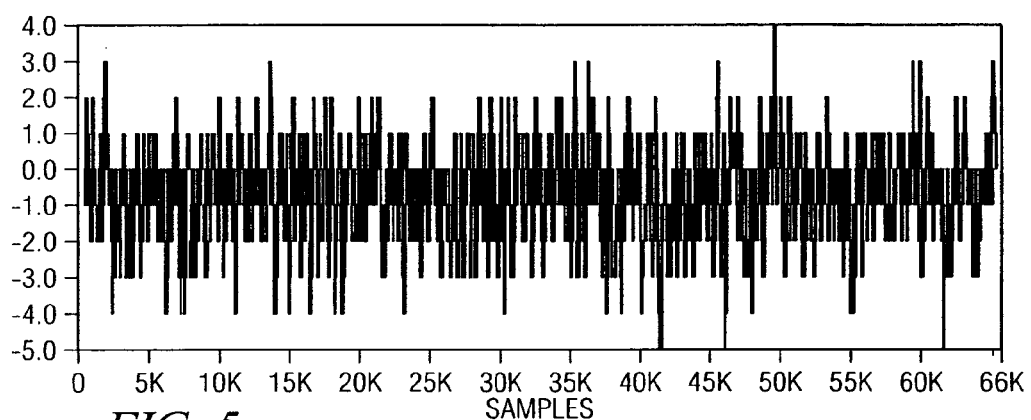
Figure 5D:
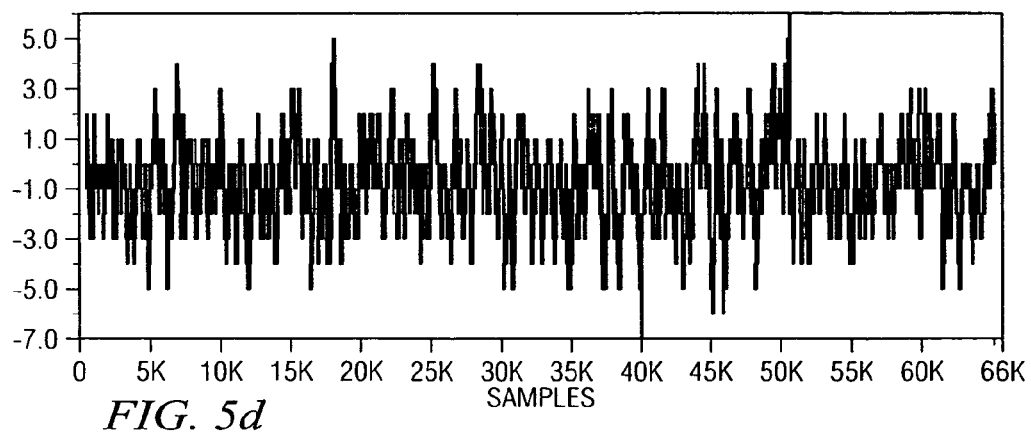

FIGS. 5a–5e depict illustrative diagrams of the integral non-linearity and the differential non-linearity of the representative 16-bit resistor string DAC calibrated by the technique of the present invention. Specifically, FIGS. 5a–5d depict the calibrated integral non-linearity of the 16-bit resistor string DAC using (1) 1024 PWL segments (see FIG. 5a), (2) 512 PWL segments (see FIG. 5b), (3) 256 PWL segments (see FIG. 5c), and (4) 128 PWL segments (see FIG. 5d) in the calibration technique illustrated by the second example. As shown in FIGS. 5a–5d, the integral non-linearity of the DAC improves as the number of PWL segments increases. It is noted that for each case, the differential non-linearity of the DAC is within about ±2 LSBs, as illustrated by the diagram of FIG. 5e. The differential non-linearity of the DAC may be improved by increasing the resolution of the DAC by a small amount, e.g., 1–2 bits. For example, the resolution of the 16-bit resistor string DAC may be increased to 17 bits to improve the DAC differential non-linearity. Such a 1-bit increase in DAC resolution would, however, typically increase the chip area of the DAC by about 10%.

A method of operating the presently disclosed DAC calibration circuit is illustrated by reference to FIG. 6. As depicted in step 602, the transfer function of the DAC to be calibrated is evaluated by a tester to determine a plurality of uniformly spaced DAC output voltage levels corresponding to a plurality of DAC input code values. The plurality of DAC input codes are then stored, as depicted in step 604, in successive memory locations by the tester. Code values corresponding to the uniformly spaced DAC output voltage levels are employed by calibration logic to index the successive memory locations storing the DAC input codes. Next, a DAC input code is received, as depicted in step 606, by the calibration logic. It is noted that the most significant bits of the DAC input code directly index the calibration memory, without requiring a search operation. The closest memory index code value less than or equal to the ideal output voltage level corresponding to the received DAC input code is then determined, as depicted in step 608, by the calibration logic. The index code value determined in step 608 is then employed, as depicted in step 610, by the calibration logic to index a location within the memory. In response, a first coarse calibration code is provided, as depicted in step 612, to the calibration logic by the memory. The next successive memory location is then indexed, as depicted in step 614, by the calibration logic; and, in response, a second coarse calibration code is provided, as depicted in step 616, to the calibration logic by the memory. Next, the first and second coarse calibration codes are employed, as depicted in step 618, by the calibration logic to compute a third calibration code using a suitable PWL approximation technique. The computed calibration code value is then provided, as depicted in step 620, by the calibration logic as in input to the DAC, which, in response, generates a calibrated output voltage closely approximating the desired output voltage.

In the preferred embodiment, the memory employed in the above-described DAC calibration circuit is an on-chip programmable non-volatile memory. For example, the memory may comprise a fuse link memory, an EEPROM, a FLASH memory, or any other suitable type of memory. It is understood, however, that a volatile memory may be alternatively employed in the event the user wishes to perform DAC calibration within a system. If a volatile on-chip memory is used, then the DAC input code values representing coarse calibration code values may be downloaded into the memory using a suitable digital interface before operating the DAC. To achieve a simpler implementation, the on-chip memory may be omitted, and the coarse calibration codes may be externally provided to the on-chip calibration logic. Accordingly, in this simplified implementation, the coarse calibration codes may be measured and stored elsewhere in the system, and may then be externally provided to the chip via digital input ports/pins, thereby further reducing the overall die area.

It will also be appreciated by those of ordinary skill in the art that modifications to and variations of the above-described all-digital calibration of string DAC linearity using area efficient PWL approximation may be made without departing from the inventive concepts disclosed herein. Accordingly, the invention should not be viewed as limited except as by the scope and spirit of the appended claims.

What is claimed is:

1. A calibrated digital-to-analog converter (DAC), comprising:
   a main DAC having a digital input and an analog output, the main DAC being configured, in the event a first input code value is applied to its digital input, to produce a corresponding first output voltage level at its analog output based on a transfer function of the main DAC;
   a memory having an address input and a data output, the memory being configured to store a first plurality of code values at respective locations within the memory, the respective memory locations being addressable by a second plurality of code values,
   wherein corresponding pairs of code values of the first and second pluralities of code values define respective breakpoints of a piecewise linear (PWL) approximation of the DAC transfer function, each code value of the second plurality representing a respective input code value, successive code values of the first plurality representing uniformly spaced output voltage levels corresponding to the respective code values of the second plurality; and
   calibration logic circuitry configured to receive the first input code value, to access a pair of code values of the first plurality from successive locations within the memory based on the first input code value, to compute a third code value using the accessed pair of code values by a PWL approximation technique, and to apply the computed code value to the digital input of the main DAC, thereby allowing the main DAC to produce a calibrated output voltage level corresponding to the first input code value.

2. The calibrated DAC of claim 1 wherein the respective input code values and the uniformly spaced output voltage levels corresponding thereto are determined by a tester coupleable to the main DAC, the tester being further coupleable to the memory and configurable to store the respective input code values at memory locations addressable by the second plurality of code values.

3. The calibrated DAC of claim 1 wherein the calibration logic is further configured to determine a respective code value of the second plurality consisting of the most significant bits of the first input code applied to the main DAC, to apply the determined respective code value to the memory address input to access a first member of the pair of code values of the first plurality from the memory location addressed thereby, to access a second member of the pair of code values of the first plurality from a next successive memory location, and to compute the third code value using the accessed first and second members of the pair of code values of the first plurality by the PWL approximation technique.

4. The calibrated DAC of claim 3 wherein the PWL approximation technique is defined by the equation $$I0=I1+(I2-I1)(D0-VI1)/(VI2-VI1),$$

wherein D0 is a desired output voltage, I0 is the computed third code value, I1 and I2 are the first and second members of the pair of code values of the first plurality, respectively, and VI1 and VI2 are the successive code values of the second plurality corresponding to I1 and I2, respectively, and wherein the calibrated output voltage level approximates the desired output voltage D0.

5. The calibrated DAC of claim 1 wherein the memory comprises a nonvolatile memory circuit.

6. The calibrated DAC of claim 5 wherein the memory circuit is selected from the group consisting of a fuse link memory, an EEPROM, and a FLASH memory.

7. The calibrated DAC of claim 1 wherein the main DAC is a monotonic DAC.

8. The calibrated DAC of claim 7 wherein the monotonic DAC is a resistor string DAC.

9. The calibrated DAC of claim 1 wherein the memory comprises a volatile memory circuit.

10. The calibrated DAC of claim 9 wherein the memory circuit is configured to receive the first plurality of code values downloaded via a digital interface.

11. The calibrated DAC of claim 1 wherein the main DAC, the memory, and the calibration logic are implemented on an integrated circuit.

12. The calibrated DAC of claim 1 wherein the main DAC and the calibration logic are implemented on an integrated circuit, and the memory is implemented external to the integrated circuit.

13. A method of calibrating a digital-to-analog converter (DAC), the DAC having a digital input and an analog output, the DAC being configured and arranged to produce a voltage level at its analog output in response to a code value applied to its digital input based on a transfer function of the DAC, the method comprising the steps of:

- determining first and second pluralities of code values, each code value of the second plurality representing a respective DAC input code value, successive code values of the first plurality representing uniformly spaced DAC output voltage levels corresponding to the respective code values of the second plurality,
- wherein corresponding pairs of code values of the first and second pluralities of code values define respective breakpoints of a piecewise linear (PWL) approximation of the DAC transfer function;
- storing the first plurality of code values at respective locations within a memory, the respective memory locations being addressable by the second plurality of code values;
- receiving a first input code value by calibration logic circuitry;
- accessing a pair of code values of the first plurality from successive locations within the memory based on the first input code value by the calibration logic circuitry;
- computing a third code value using the accessed pair of code values by a PWL approximation technique by the calibration logic circuitry; and
- applying the computed code value to the digital input of the DAC, thereby allowing the DAC to produce a calibrated output voltage level corresponding to the first input code value.

14. The method of claim 13 wherein the determining step includes determining the first and second pluralities of code values by a tester coupleable to the DAC.

15. The method of claim 13
wherein the accessing step includes determining a respective code value of the second plurality consisting of the most significant bits of the code value applied to the DAC, applying the determined respective code value to an address input of the memory to access a first member of the pair of code values of the first plurality from the memory location addressed thereby, and accessing a second member of the pair of code values of the first plurality from a next successive memory location, and wherein the computing step includes computing the third code value using the accessed first and second members of the pair of code values of the first plurality by the PWL approximation technique.

16. The method of claim 15 wherein the PWL approximation technique employed in the computing step is defined by the equation $$I0=I1+(I2-I1)(D0-VI1)/(VI2-VI1),$$

wherein D0 is a desired output voltage, I0 is the computed third code value, I1 and I2 are the first and second members of the pair of code values of the first plurality, respectively, and VI1 and VI2 are the successive code values of the second plurality corresponding to I1 and I2, respectively, and wherein the calibrated output voltage level approximates the desired output voltage D0.

17. The method of claim 13 wherein the memory comprises a nonvolatile memory circuit.

18. The method of claim 17 wherein the memory circuit is selected from the group consisting of a fuse link memory, an EEPROM, and a FLASH memory.

19. The method of claim 13 wherein the DAC is a resistor string DAC.

20. The method of claim 13 wherein the DAC, the memory, and the calibration logic circuitry are implemented on an integrated circuit.

21. The method of claim 13 wherein the second plurality of code values is obtained from M most significant bits of an M-segment piecewise linear calibration.

* * * * *